(12) United States Patent
Waitzman, III et al.

(10) Patent No.: US 8,520,370 B2
(45) Date of Patent: Aug. 27, 2013

(54) AUDIO VISUAL ENHANCEMENT APPARATUS

(75) Inventors: James W. Waitzman, III, Homewood, AL (US); Lewis Dorsey Cox, Leeds, AL (US); Zachary A. Griggs, Woodstock, GA (US)

(73) Assignee: Screendoor Studio, Inc., Birmingham, AL (US)

( * ) Notice: Subject to any disclaimer, the term of this patent is extended or adjusted under 35 U.S.C. 154(b) by 275 days.

(21) Appl. No.: 12/964,236

(22) Filed: Dec. 9, 2010

(65) Prior Publication Data

US 2012/0147487 A1 Jun. 14, 2012

(51) Int. Cl.
*G06F 1/16* (2006.01)

(52) U.S. Cl.
USPC ............. 361/679.01; 361/679.02; 381/161; 381/345; 359/802

(58) Field of Classification Search
USPC ...................... 361/679.41; 359/802
See application file for complete search history.

(56) References Cited

U.S. PATENT DOCUMENTS

| | | | | | |
|---|---|---|---|---|---|
| 4,991,935 | A | * | 2/1991 | Sakurai | 359/804 |
| 5,130,853 | A | * | 7/1992 | Sakurai | 359/803 |
| 5,307,209 | A | | 4/1994 | Iaquinto | |
| 5,325,278 | A | | 6/1994 | Tortola | |
| 6,067,459 | A | * | 5/2000 | Lincoln et al. | 455/566 |
| 6,347,796 | B1 | * | 2/2002 | Grossman et al. | 273/148 B |
| 6,536,589 | B2 | * | 3/2003 | Chang | 206/320 |
| 6,989,948 | B2 | * | 1/2006 | Hussaini et al. | 359/809 |
| 7,286,306 | B2 | * | 10/2007 | Wu | 359/809 |
| 7,312,817 | B2 | * | 12/2007 | Schinner | 348/207.2 |
| 7,464,814 | B2 | * | 12/2008 | Carnevali | 206/320 |
| 7,471,466 | B2 | * | 12/2008 | Bendror et al. | 359/802 |
| 7,567,394 | B1 | * | 7/2009 | Monte | 359/810 |
| 7,778,431 | B2 | * | 8/2010 | Feng et al. | 381/160 |
| 7,792,550 | B2 | * | 9/2010 | Lishan | 455/566 |
| 8,031,896 | B2 | * | 10/2011 | Chick et al. | 381/349 |
| 2002/0009195 | A1 | * | 1/2002 | Schon | 379/454 |
| 2004/0204204 | A1 | * | 10/2004 | Brilliant et al. | 455/575.1 |
| 2004/0212822 | A1 | * | 10/2004 | Schinner | 358/1.15 |
| 2005/0018868 | A1 | * | 1/2005 | Chick et al. | 381/349 |
| 2005/0078385 | A1 | | 4/2005 | Hussaini | |
| 2006/0171045 | A1 | * | 8/2006 | Carnevali | 359/802 |
| 2006/0216024 | A1 | * | 9/2006 | Jutamulia | 396/544 |
| 2007/0223745 | A1 | * | 9/2007 | Feng et al. | 381/160 |
| 2009/0257136 | A1 | | 10/2009 | Liu | |
| 2010/0134984 | A1 | * | 6/2010 | Lum et al. | 361/725 |
| 2010/0183170 | A1 | | 7/2010 | Shen | |

FOREIGN PATENT DOCUMENTS

| | | |
|---|---|---|
| KR | 2006065993 | 6/2006 |
| WO | 2009142723 | 11/2009 |

OTHER PUBLICATIONS

"Magnifico Plus" http://www.hearmore.com/store/ProdView.asp?idProduct=3061&product=Magnifico-Plus-2x-Portable-Small-Screen-Magnifier (accessed Aug. 13, 2010).

"Reizen Fresnel Computer/Stand Magnifier" http://www.maxiaids.com/store/prodview.asp?idstore=6&idproduct=1647&showall=yes (accessed Aug. 13, 2010).

* cited by examiner

*Primary Examiner* — Anthony Q Edwards

(74) *Attorney, Agent, or Firm* — Angela Holt; Bradley Arant Boult Cummings LLP

(57) ABSTRACT

An apparatus of the present disclosure enhances the audio/visual experience of a portable digital device, and comprises a lens positioning slot, a lens storage compartment, a passive audio amplifier, a receiving station.

4 Claims, 12 Drawing Sheets

AUDIO VISUAL ENHANCEMENT APPARATUS

FIELD OF THE DISCLOSURE

The present disclosure relates to a receiving station for smart phones and digital devices. In particular, the present disclosure relates to a receiving station that magnifies the video display screens, and passively amplifies the integrated audio speaker of the digital device.

BACKGROUND OF THE DISCLOSURE

Smart phones and portable digital devices have become increasingly popular and compact over the past several years. Due to increased speed, memory, and functionality, such devices are replacing traditional laptop computers as the preferred portable computing device. Given this trend, an apparatus is needed to enhance the audio and visual components of such devices, further increasing functionality and enjoyment.

SUMMARY

An apparatus in accordance with an embodiment of the present disclosure comprises a receiving station for amplifying the audio output and magnifying the video display of digital devices in both the portrait or landscape orientations. No additional power is required to achieve the magnification or amplification. The apparatus of the present disclosure enhances the existing Audio/Visual ("A/V") output of digital devices without drawing any additional power from the device itself.

To amplify the sound, the apparatus includes a passive sound amplifying mechanism comprising a tapered, teardrop or concave shaped cup or recess positioned to receive sound from the onboard speaker of the digital device and project such sound upward and outward thereby amplifying and increasing its volume while directing sound toward the listener's ears for audio enhancement.

The apparatus of the present disclosure includes a docking or receiving area designed to securely receive and engage the digital device in either the portrait or landscape orientations, and to further orient the digital device's onboard speaker to the amplification mechanism via a sound channel.

To magnify the video display, the apparatus of the present disclosure includes a magnification mechanism comprising a lens and lens holder (slot) to hold the lens upright and parallel to the screen at the lens' correct focal length. In the preferred embodiment, the lens is a Fresnel lens. The docking area of the apparatus is positioned to optimize both viewing distance and viewing angle for either portrait or landscape orientations.

When the magnifying mechanism is not in use, the lens may be removed from its holder and stored in a receiving cavity substantially parallel to the base.

BRIEF DESCRIPTION OF THE DRAWINGS

The present disclosure is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

Figure 1A:
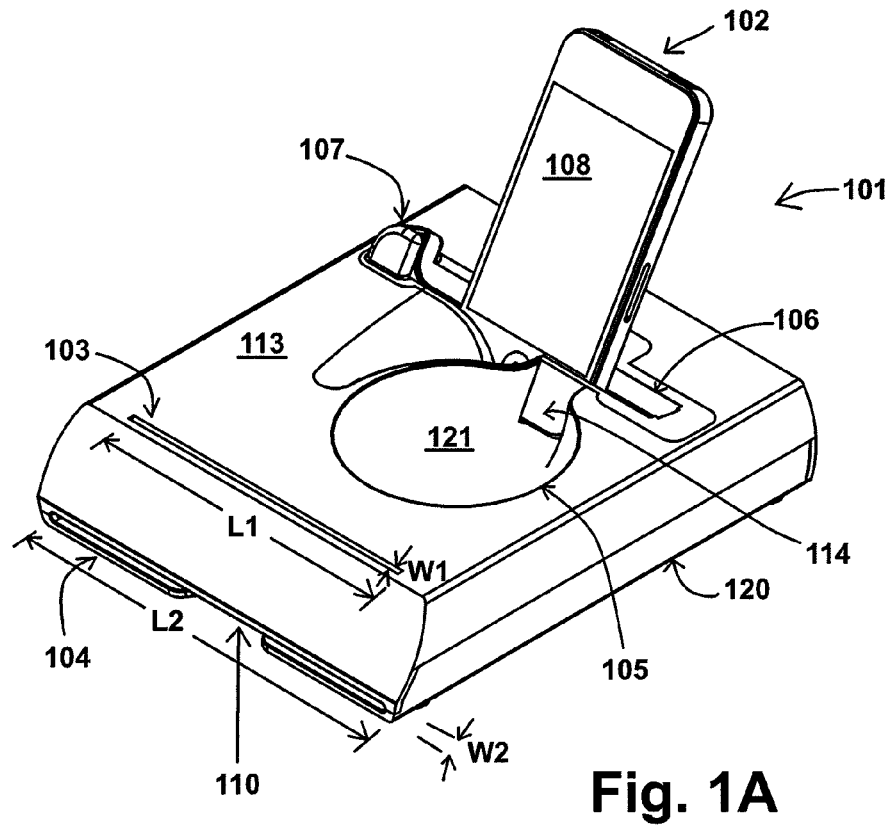
FIG. 1A is a front perspective view of an audio/visual enhancement apparatus in accordance with an embodiment of the present disclosure with a digital device docked in a portrait position therein.

FIG. 1A is a front perspective view of an audio/visual enhancement apparatus 101 in accordance with an embodiment of the present disclosure with a digital device docked 102 in a portrait position therein. In one embodiment, the apparatus 101 is formed from a base 120 generally rectangular in shape and comprises a lens positioning slot 103, a lens storage compartment 104, a passive audio amplifier 105, a receiving station 106.

The lens positioning slot 103 is of appropriate size (length, L1, and thickness, W1) to securely position a magnifying device (not shown) such as a lens, at the appropriate focal distance from the digital device 102 in order to magnify the video display 108 of the device 102. In one embodiment the magnifying device is a Fresnel lens. In one embodiment, the lens positioning slot 103 is located within the top surface of the base 120. In alternative embodiments, the lens positioning slot may be located within the front or side surface of the base. Furthermore, the magnifying device may be attached to the base using other means known in the art, such as clips.

Figure 1B:
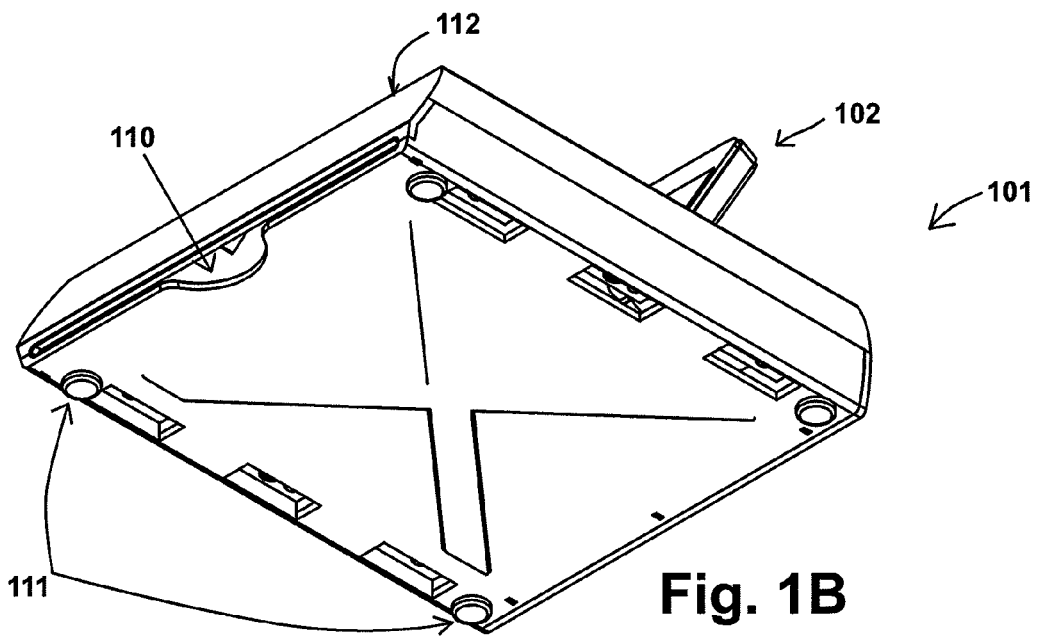
FIG. 1B is a bottom prospective view of the audio/visual enhancement apparatus of FIG. 1.

The lens storage compartment 104 is of appropriate size (length, L2, and thickness, W2) to receive the entire magnifying device for ease of storage and transport. In one embodiment, the lens storage compartment 104 is positioned at the base 120 of the apparatus 101. The lens storage compartment 104 further comprises a carve-out 110 which allows the user to easily retrieve the magnifying device from its stored position. FIG. 1B provides another view of the carve-out 110. Also depicted in FIG. 1B are feet 111 upon which the apparatus 101 rests. The feet 111 are composed of standard materials known in the art, and preferably resist slipping or sliding on a smooth surface (not shown).

The passive audio amplifier 105 of the apparatus 101 is embodied as a tear-drop or substantially circular and spherically shaped recess on the top surface 113 of the apparatus. The opening 114 to the passive audio amplifier 105 is positioned to correspond with the on-board speaker (not shown) of the digital device 102. Sound waves (not shown) from the on-board speaker (not shown) of the digital device 102 are amplified passively without the assistance of a powered speaker or amplifier by virtue of the physical properties of sound waves. The passive audio amplifier 105 reflects and directs sound waves towards each other, as well as upward and away from the apparatus 101 and towards the user (not shown). The shape of the recess forming the passive audio amplifier creates a reflective surface 121 causing the sound waves to travel towards each other allowing the amplitudes of the sound waves to combine producing a louder sound.

The receiving station 106 receives the digital device 102 and secures the device 102 at an angle substantially parallel to the magnifying device (not shown) secured by the lens position slot 103. The design of the receiving station 106 may be modified in other embodiments depending on the type of digital device that is placed in the apparatus 101. Accordingly, the apparatus 101 can accommodate digital devices of many different size and shapes, and can secure such devices in either the landscape or portrait orientations.

Figure 1C:
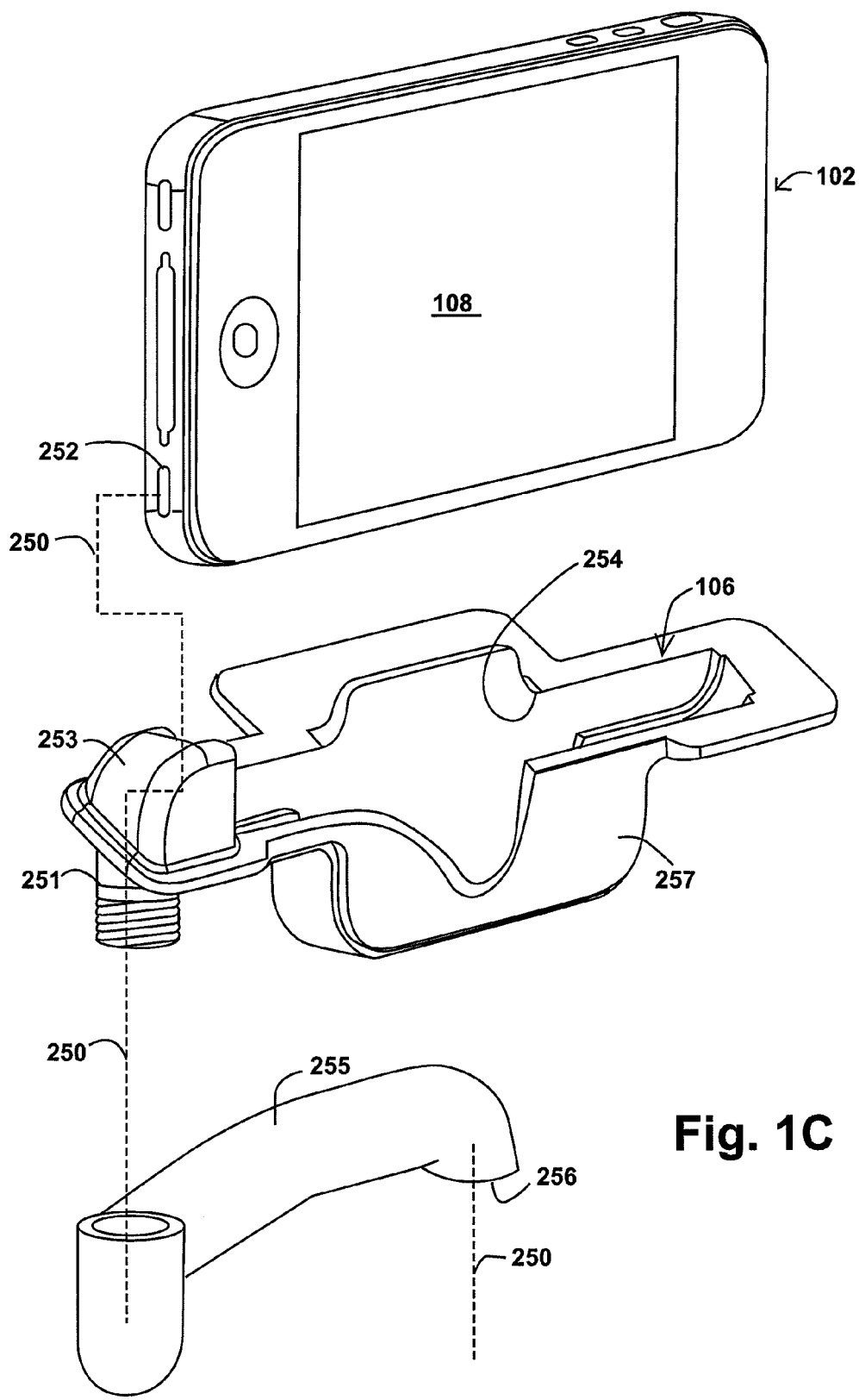
FIG. 1C is an exploded perspective view of the audio/visual enhancement device of FIG. 1 showing the receiving station and channel thereof with the digital device in the landscape position.

FIG. 1C depicts the digital device 102 in the landscape position in relation to the receiving station 106. The digital device 102 fits within a slot 254 of the receiving station 106. When the digital device 102 is inserted in the receiving station 106, a speaker 252 on the digital device 102 indirectly interfaces with a quarter-circle hood 253. In this regard, sound travels from the speaker 252 through the hood 254 as referenced by line 250.

In addition, the receiving station 106 comprises a channel attachment 251 for receiving the channel 255. When the channel 255 is inserted over the channel implement 251, sound from the hood 253 travels through the channel attachment 251 and through the channel 255. The opening 256 of the channel 255 interfaces with the opening 114 (FIG. 1A). Sound traveling out of the opening 114 is transmitted by the reflective surface 121 of the passive audio amplifier 105. Note that a portion of the receiving station 106 forms a cavity 257. Such cavity 257 is for receiving the digital device 102 in the portrait position.

Figure 1D:
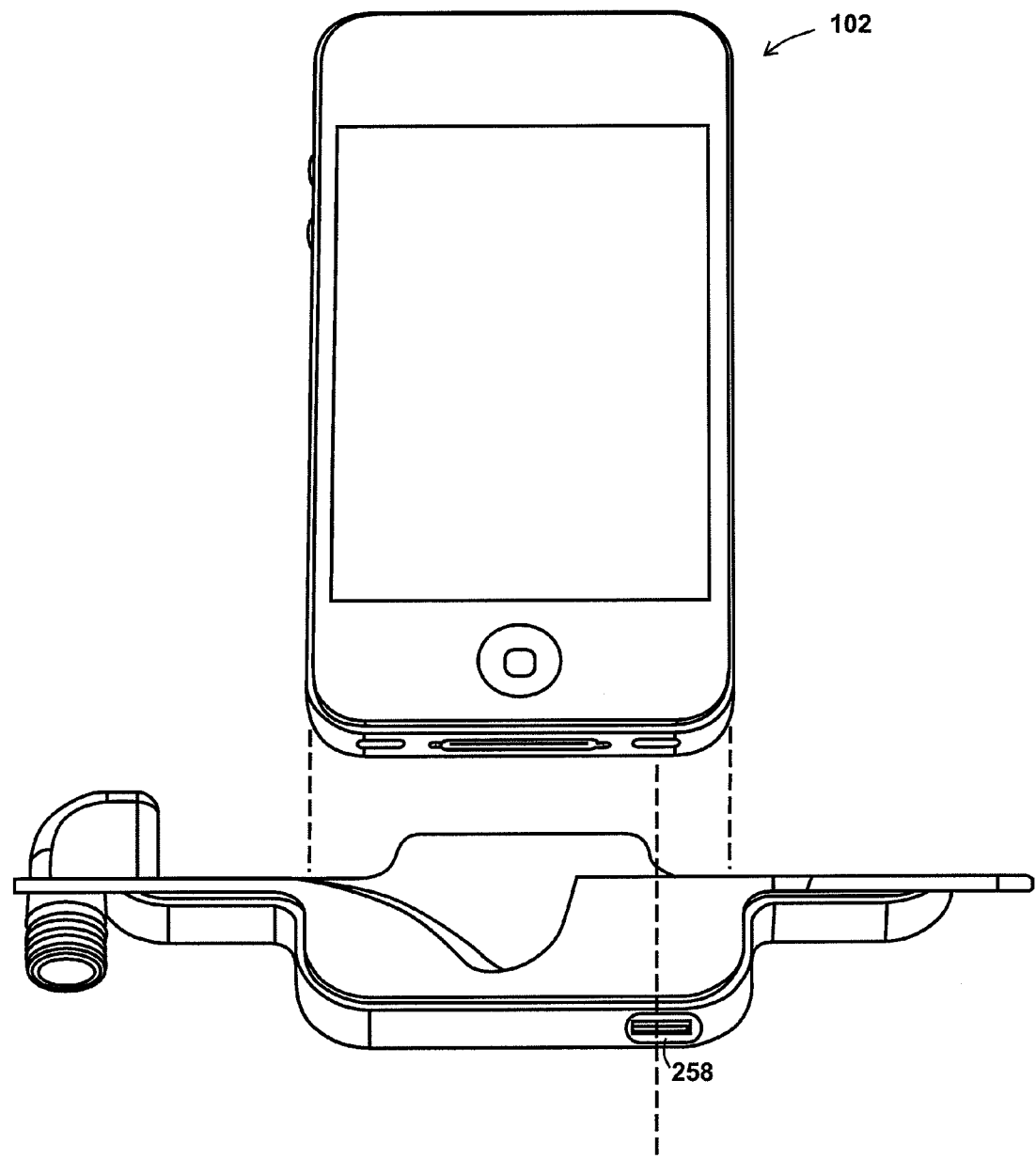
FIG. 1D is an exploded front view of the audio/visual enhancement device of FIG. 1 showing the receiving station, with the digital device in the portrait position.

With reference to FIG. 1D, the digital device 102 is in the portrait position. The speaker (not shown) on the digital device 102 when the digital device 102 is in the portrait position aligns with an opening 258 in the receiving station 106. Such opening 258 directs sound from the speaker to through the opening 114 (FIG. 1A) to the reflective surface 121 (FIG. 1A) of the passive amplifier 105 (FIG. 1A).

Figure 2A:
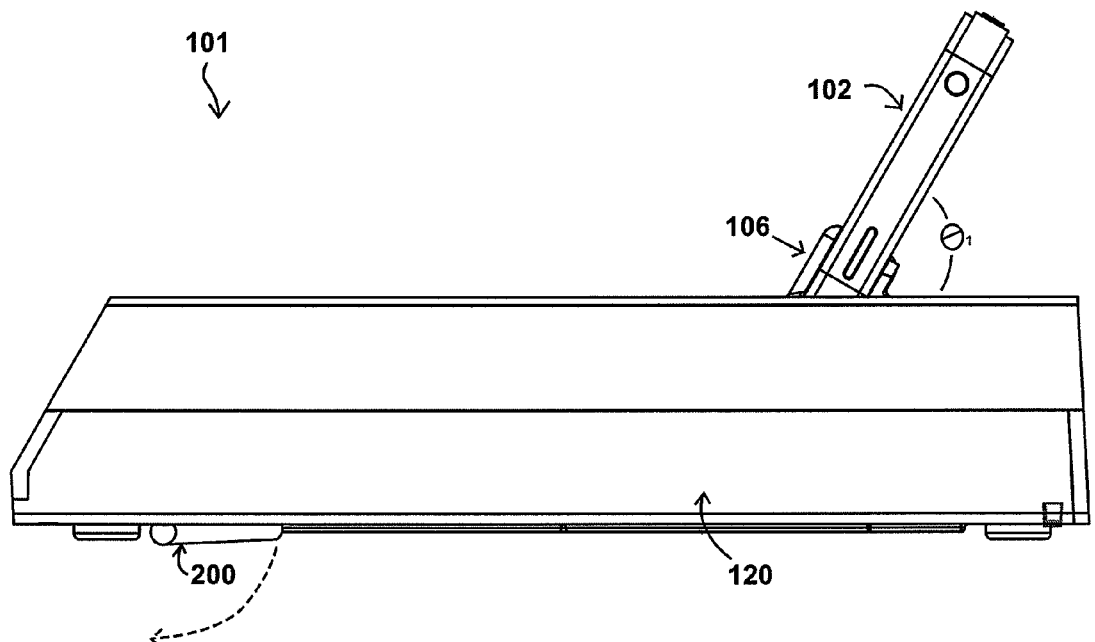
FIG. 2A is a right side view of the audio/visual enhancement apparatus of FIG. 1 with a digital device thereon in landscape position.

FIG. 2A is a right side view of the apparatus 101. The digital device 102 is retained in the apparatus 101 via the receiving station 106 at an angle $\theta_1$ which corresponds with the angle of the lens (not shown). The apparatus 101 further has a leg 200. While only one leg 200 is shown in FIG. 2A, the apparatus 101 further has a second leg (not shown) on an opposing side of the base 120. FIG. 2A depicts the leg 200 in a retracted position such that the base 120 sits level on a support (such as a table).

Figure 2B:
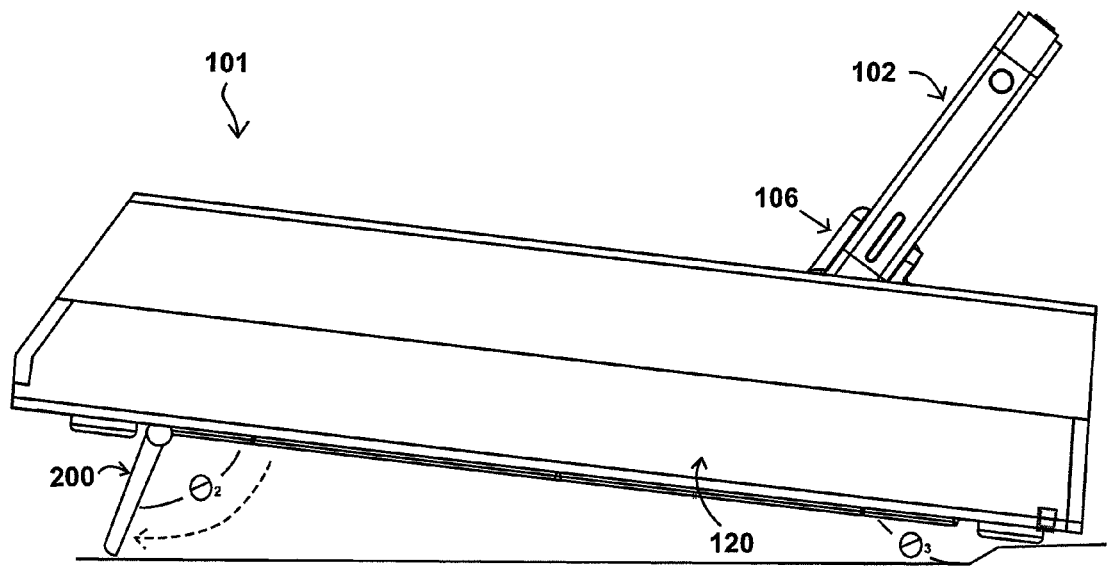
FIG. 2B is the right side view of the audio/visual enhancement apparatus of FIG. 1 showing an extended leg.

FIG. 2B depicts the side view of the apparatus 101. However, in FIG. 2B, the leg 200 is extended from the base 120 at an angle $\theta_2$. When the leg 200 is extended, the base 120 is positioned at an angle $\theta_3$ from the support (such as a table) on which the base 120 sits.

Figure 3:
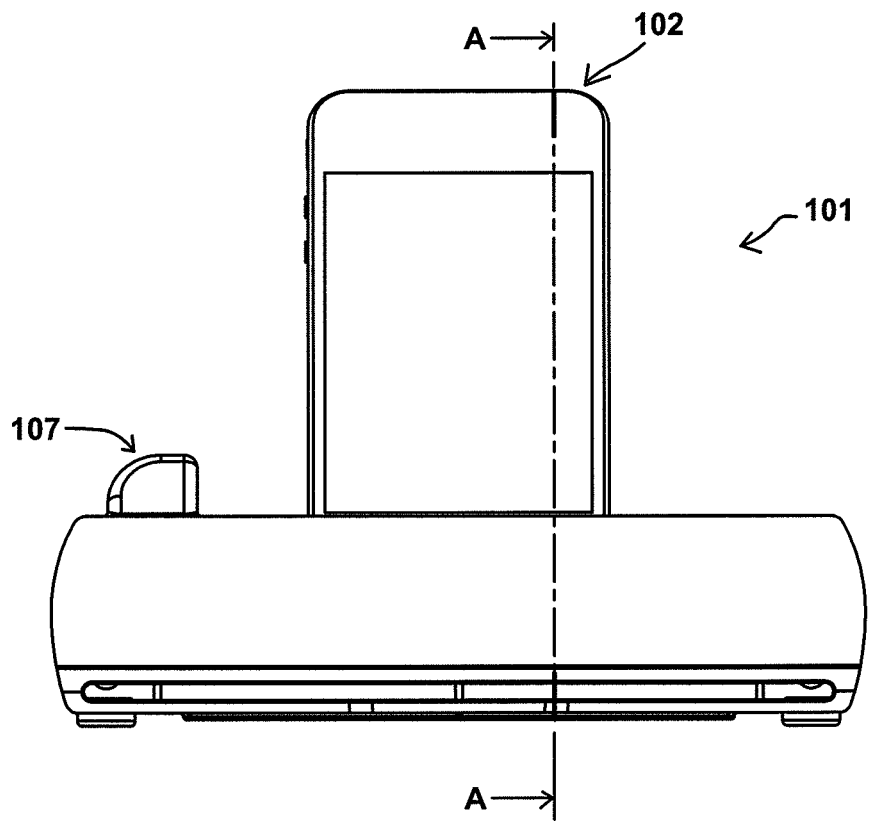
FIG. 3 is a front view of the audio/visual enhancement apparatus of FIG. 1.

FIG. 3 is a front view of the apparatus 101 depicting the digital device 102 in the portrait orientation secured within the apparatus 101. Note that whether a user places the digital device 102 in landscape or portrait position may depend upon where the speaker (not shown) of the digital device 102 is located. In this regard, the digital device may be placed in portrait position, and the sound travels through the openings 258. If the digital device 102 is placed in landscape position, the sound travels through the hood 253 (FIG. 1C) and the channel 255 (FIG. 1C).

Figure 4:
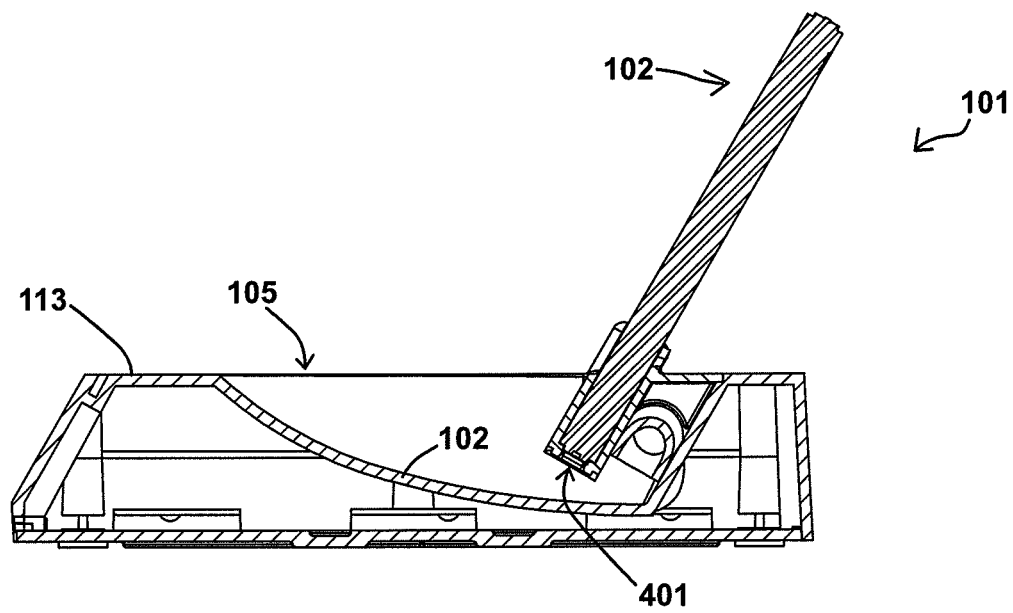
FIG. 4 is a right side view of the audio/visual enhancement apparatus of FIG. 1 taken along the lines A-A.

FIG. 4 is a right side view of the apparatus 101 taken along the lines A-A. This view demonstrates the reflective surface 121 forming the passive audio amplifier 105 within the top surface 113 of the apparatus 101. The speaker (not shown) of the digital device 102 is located at the bottom 401 of the device 102, thereby directing the sound waves into the passive audio amplifier 105.

Figure 5:
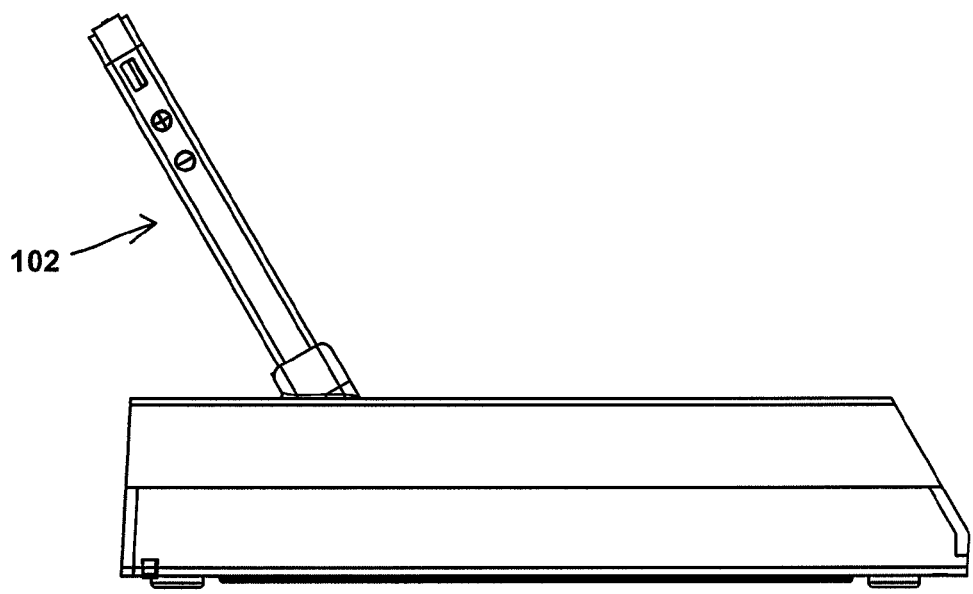
FIG. 5 is a left side view of the audio/visual enhancement apparatus of FIG. 1.
Figure 6:
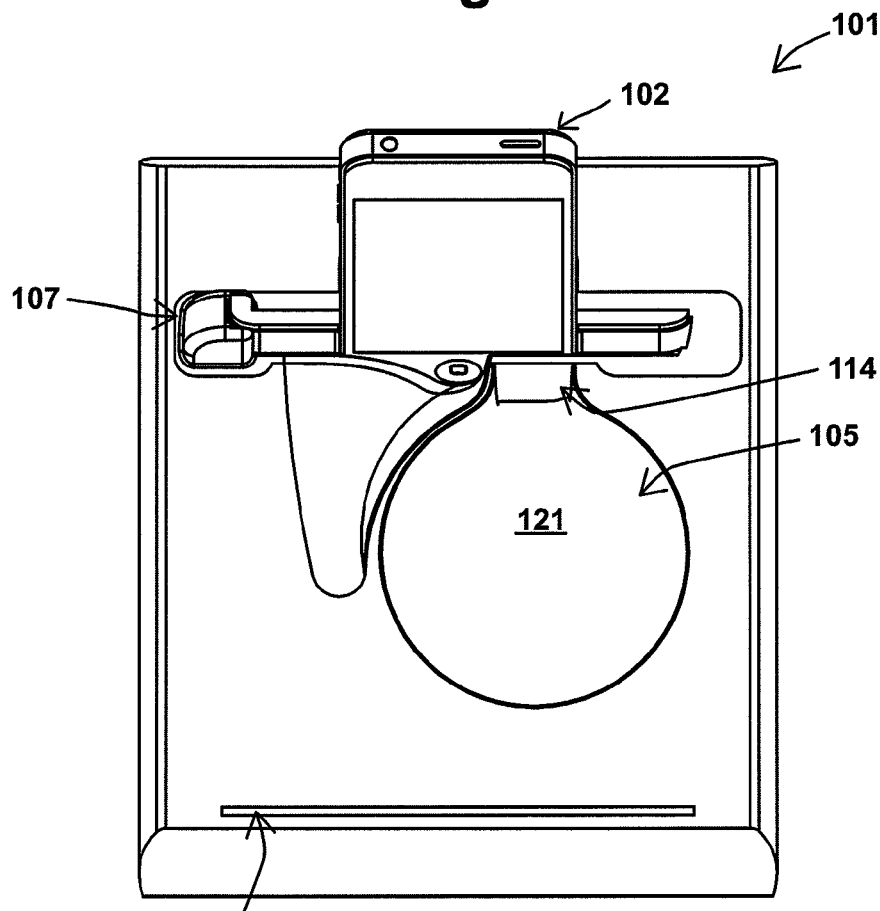
FIG. 6 is a top view of the audio/visual enhancement apparatus of FIG. 1.

FIG. 5 is a left side view of the apparatus 101, and FIG. 6 is a top view of the thereof, demonstrating the components discussed above.

Figure 7:
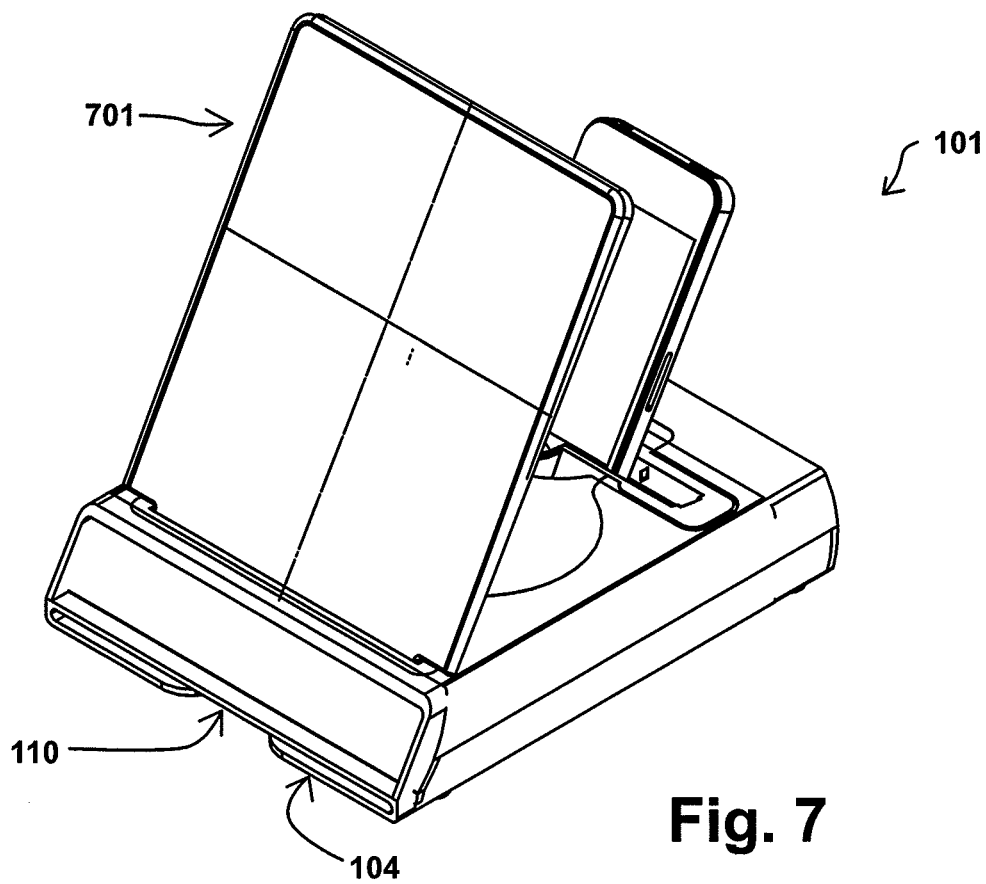
FIG. 7 is a front perspective view of the audio/visual enhancement apparatus in accordance with an embodiment of the present disclosure with a magnifying lens installed thereon, and with a digital device in portrait position.
Figure 8:
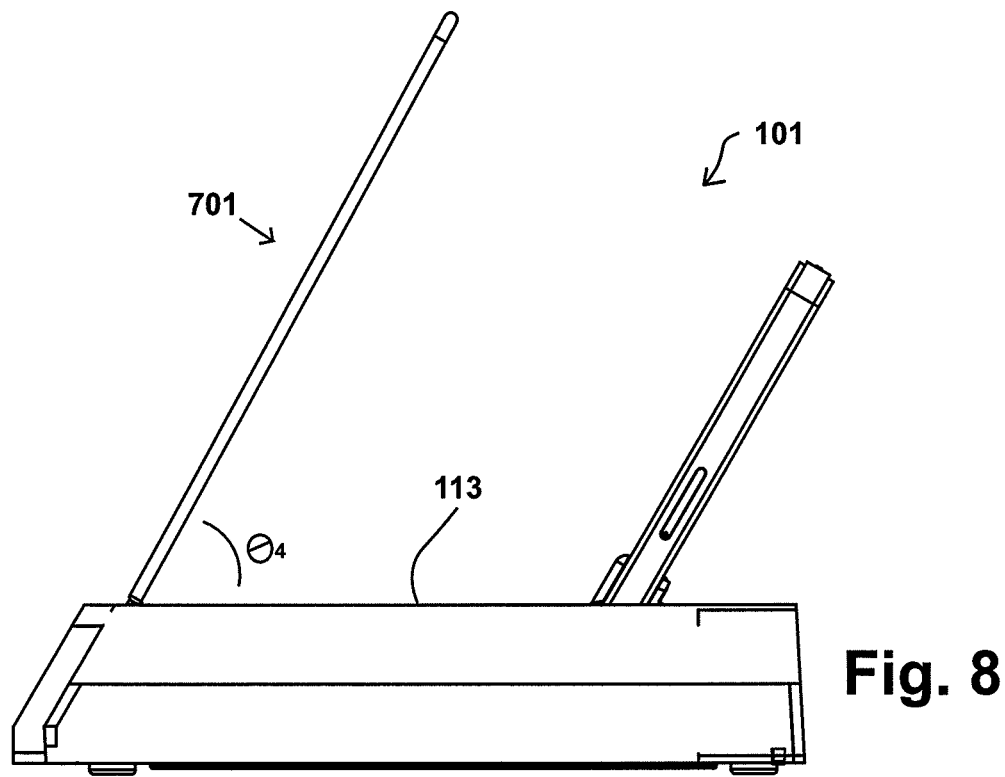
FIG. 8 is a right side view of the audio/visual enhancement apparatus of FIG. 7.

FIG. 7 is a front perspective view of the apparatus 101 with a magnifying lens 701 installed thereon. As shown in FIG. 8, the angle $\theta_4$ represents the angle of the lens 701 with respect to the top surface 113 of the apparatus, and is substantially similar to the angle $\theta_1$ shown in FIG. 2A.

Figure 9:
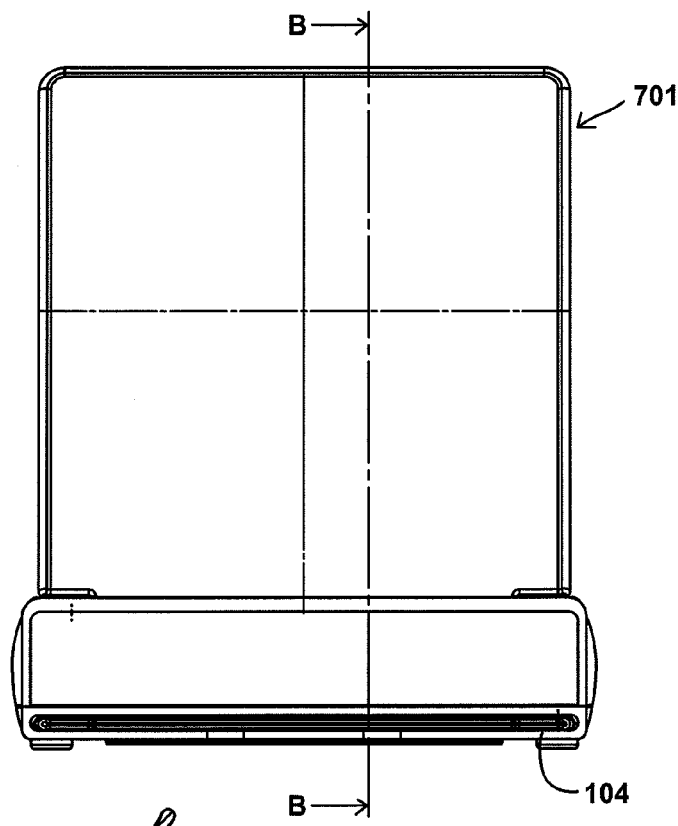
FIG. 9 is a front side view of the audio/visual enhancement apparatus of FIG. 7.
Figure 10:
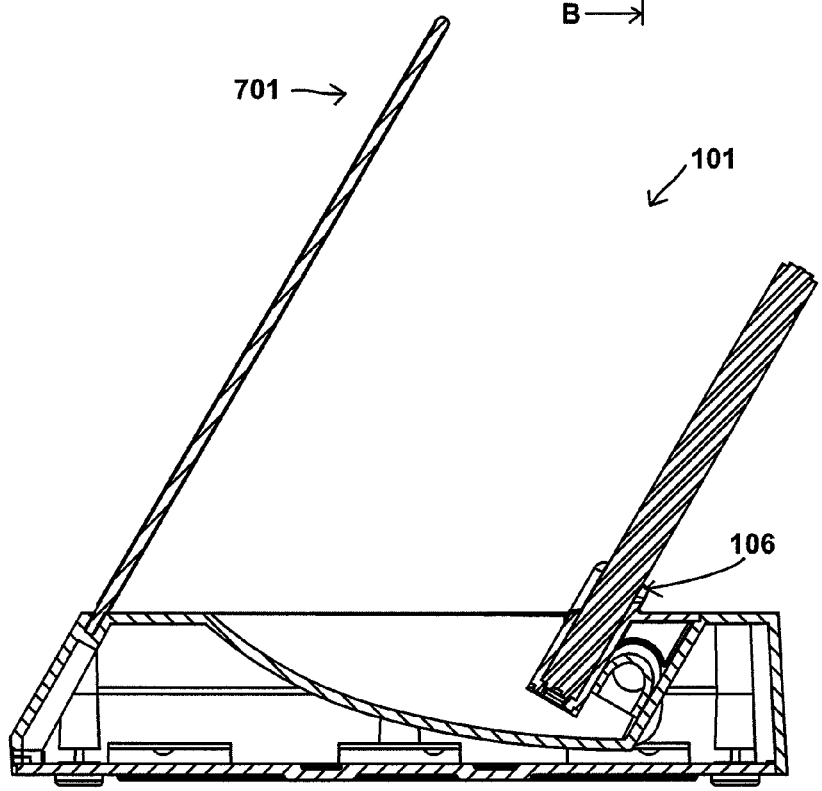
FIG. 10 is a right side view of the audio/visual enhancement apparatus of FIG. 8 taken along lines B-B.
Figure 11:
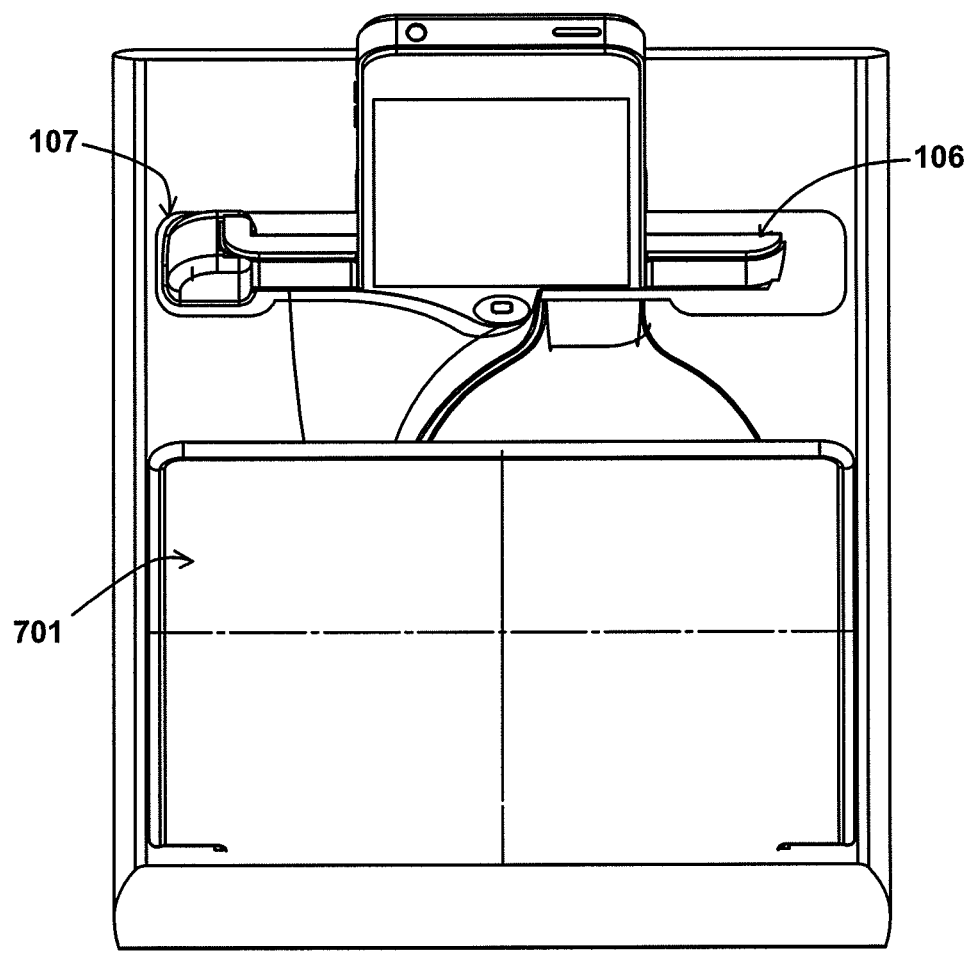
FIG. 11 is a top view of the audio/visual enhancement apparatus of FIG. 7.

FIG. 9 is a front side view of the apparatus 101, and FIG. 10 is a right side view thereof, taken along lines B-B. Finally, FIG. 11 is a top view of the apparatus 101.

Figure 12:
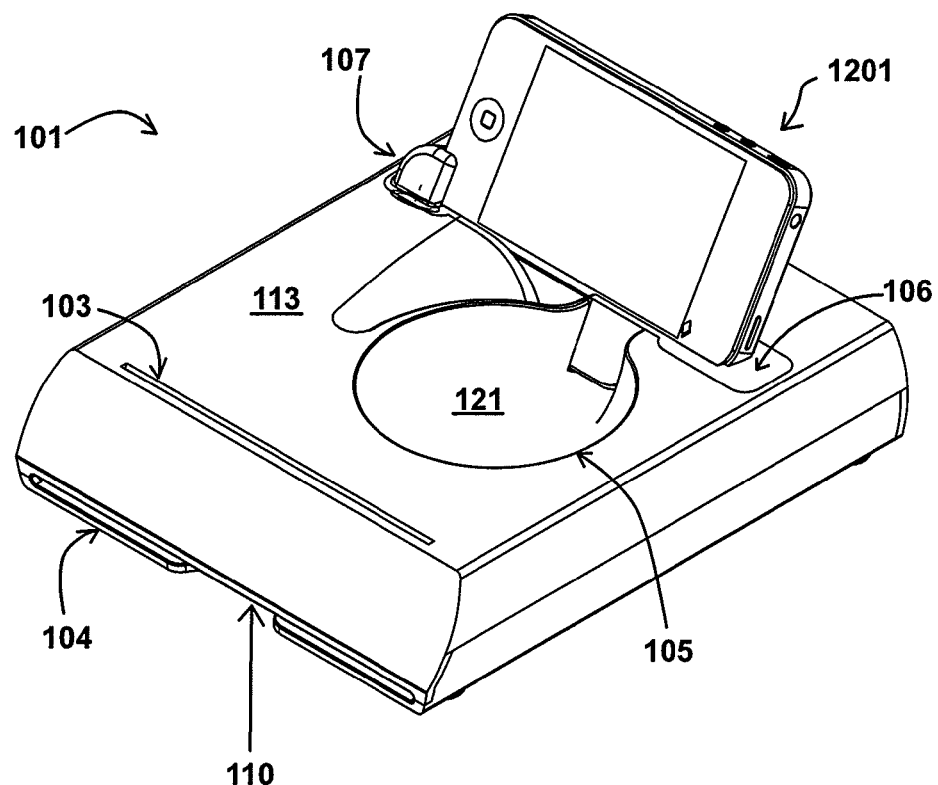
FIG. 12 is a perspective view of an audio/visual enhancement apparatus in accordance with an embodiment of the present disclosure with a digital device docked in a landscape position therein.

FIG. 12 is a perspective view of the apparatus 101 with a digital device 1201 docked in a landscape position therein. The apparatus 101 is generally rectangular in shape and comprises a lens positioning slot 103, a lens storage compartment 104, a passive audio amplifier 105, and a receiving station 106 which secures the device 1201 to the apparatus 101.

Figure 13:
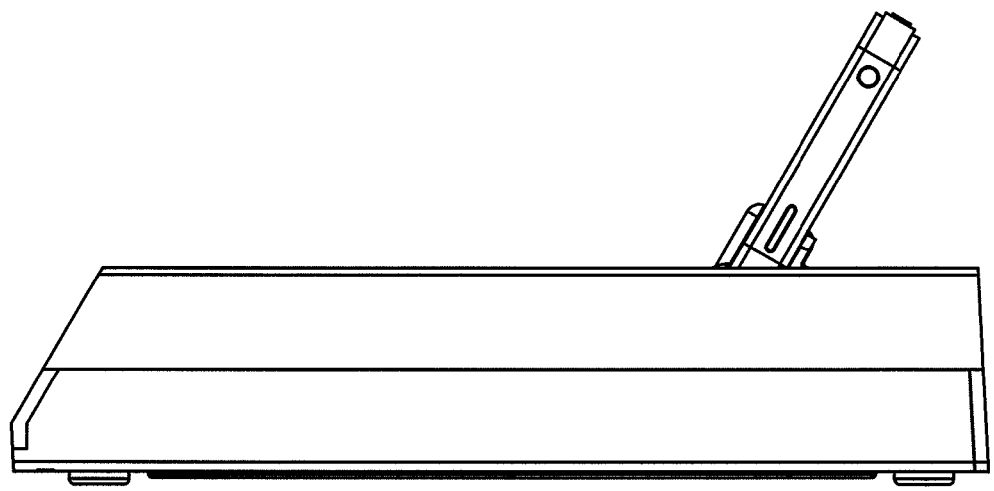
FIG. 13 is a right side view of the audio/visual enhancement apparatus of FIG. 12.
Figure 14:
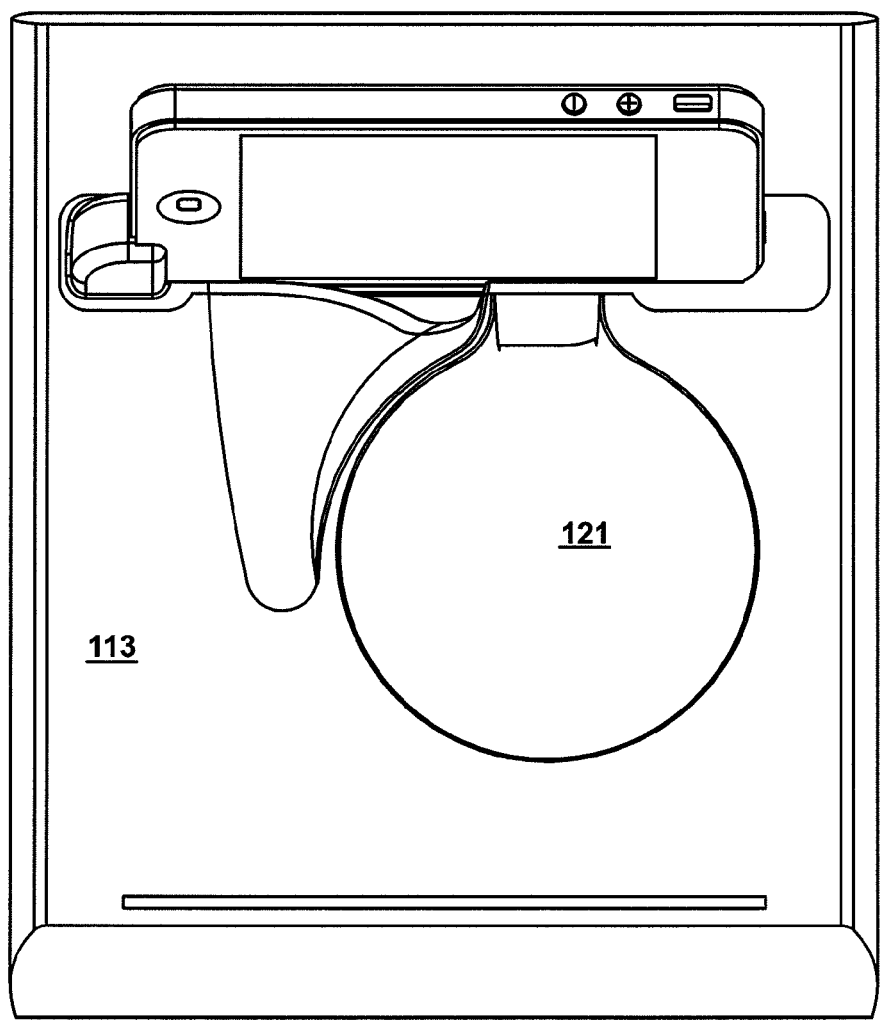
FIG. 14 is a top view of the audio/visual enhancement apparatus of FIG. 12.
Figure 15:
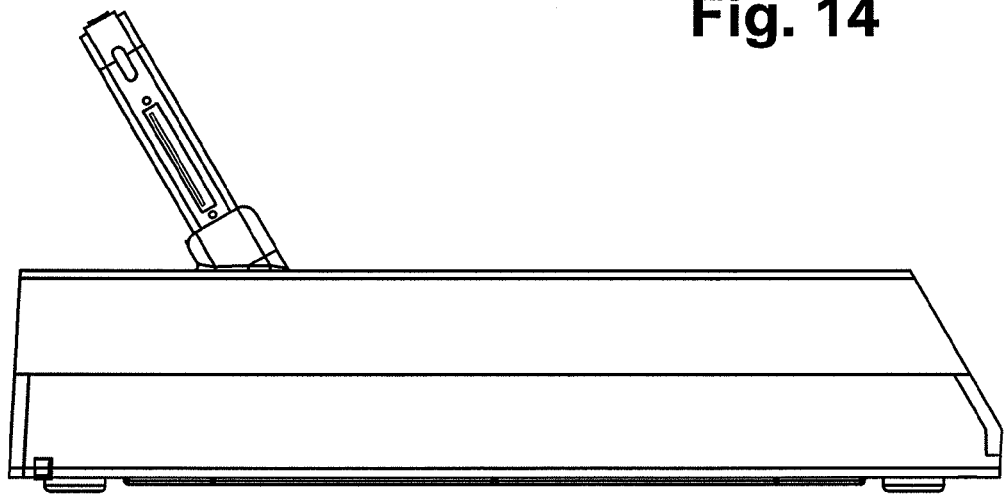
FIG. 15 is a left side view of the audio/visual enhancement apparatus of FIG. 12.

FIG. 13 is a right side view of the apparatus 101, FIG. 14 is a top view of the thereof, and FIG. 15 is a left side view thereof.

Figure 16:
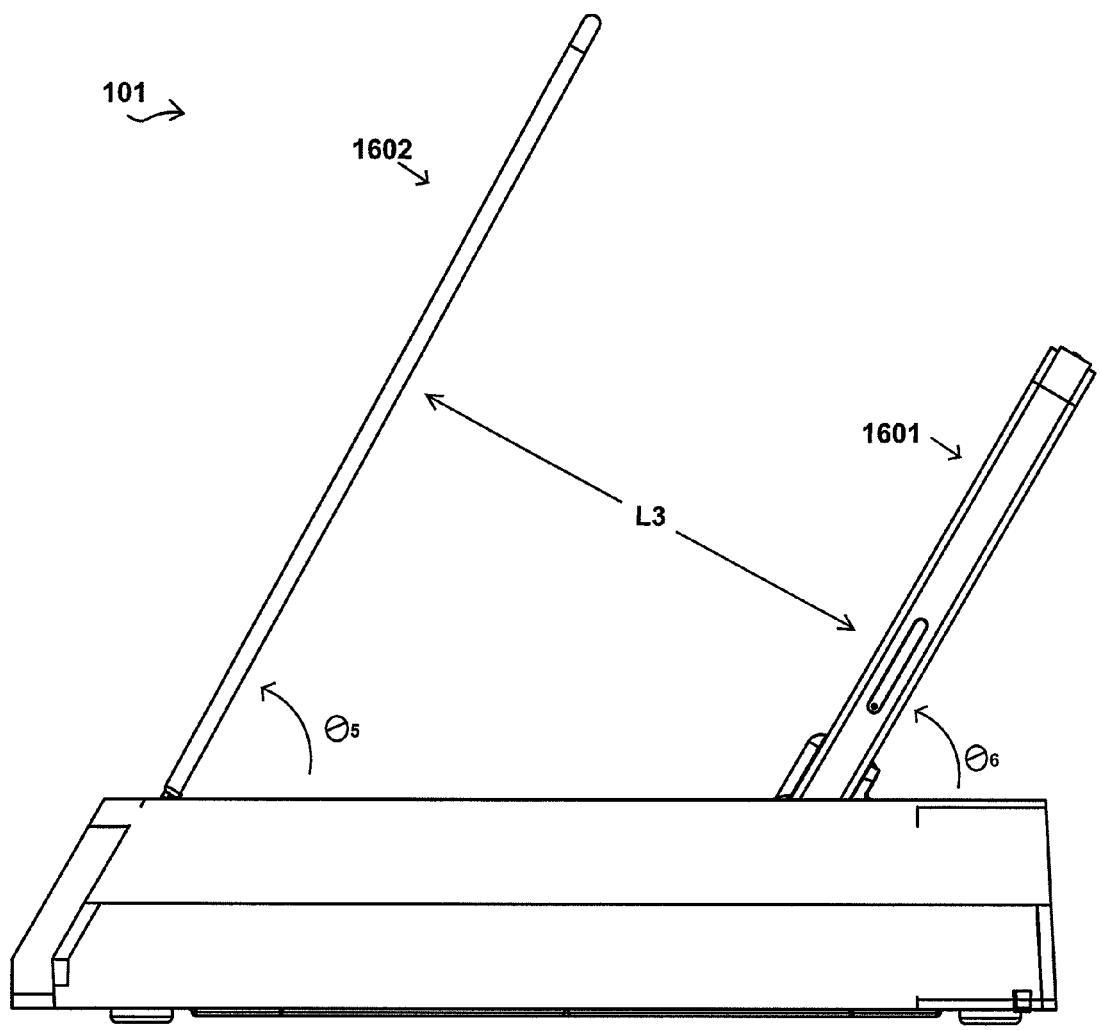
FIG. 16 is a right side view of an audio/visual enhancement apparatus in accordance with an embodiment of the present disclosure with a digital device docked in a portrait position therein and with a magnifying lens installed thereon.

FIG. 16 is a right side view of the apparatus 101 with a digital device 1601 docked in a portrait position therein and with a magnifying lens 1602 installed thereon. The angles $\theta_5$ and $\theta_6$ should be substantially similar in order to maintain the same distance L3 between the video display (not shown) of the digital device 1601.

What is claimed is:

1. An apparatus, comprising:
   a base;
   a lens positioning slot,
   a lens storage compartment,
   a passive audio amplifier, and
   a receiving station.

2. The apparatus of claim 1, wherein said lens positioning slot is angled to receive a magnifying lens and secure said lens in a position substantially parallel to a digital device positioned within said receiving station.

3. The apparatus of claim 1, wherein said passive audio amplifier is formed as a substantially spherical recess within said base.

4. The apparatus of claim 1, wherein said receiving station and said lens positioning slot are offset from said base at a substantially similar angle.

\* \* \* \* \*